United States Patent [19]

Umezaki et al.

[11] Patent Number: 4,503,517
[45] Date of Patent: Mar. 5, 1985

[54] MAGNETIC BUBBLE MEMORY DEVICE

[75] Inventors: Hiroshi Umezaki, Koganei; Naoki Koyama; Yooji Maruyama, both of Hachioji; Yutaka Sugita, Tokorozawa, all of Japan

[73] Assignee: Hitachi, Ltd., Tokyo, Japan

[21] Appl. No.: 543,422

[22] Filed: Oct. 19, 1983

[30] Foreign Application Priority Data

Oct. 20, 1982 [JP] Japan .................. 57-182850

[51] Int. Cl.$^3$ ............................................. G11C 19/08
[52] U.S. Cl. ............................................ 365/36
[58] Field of Search .................................. 365/36

[56] References Cited

U.S. PATENT DOCUMENTS 3,938,110  2/1976  Kataoka et al. ................. 365/36

Primary Examiner—James W. Moffitt
Attorney, Agent, or Firm—Antonelli, Terry & Wands

[57] ABSTRACT

A magnetic bubble memory device comprises an ion-implanted region for information storage formed in a surface of a magnetic material layer and a permalloy transfer path formed near an ion implantation transfer path defined by the edge of the ion-implanted region for reading information from the ion implantation transfer path or writing information in the ion implantation transfer path. The ion implantation depth in a portion of the ion-implanted region near the permalloy transfer path is continuously changed to provide an inclined edge of the ion-implanted region.

4 Claims, 11 Drawing Figures

MAGNETIC BUBBLE MEMORY DEVICE

BACKGROUND OF THE INVENTION

The present invention relates to a magnetic bubble memory device and in particular to a high density magnetic bubble memory device suited to be used as a memory of large capacity.

In the field of the magnetic bubble memory devices, there has been proposed a bubble memory device having a composite structure in which a transfer path formed through ion implantation (hereinafter referred to as ion implantation transfer path) and a transfer path made of a permalloy (hereinafter referred to as permalloy transfer path) are employed to attain a high density and high integration degree. See Japanese Patent application Laid-Open No. 57-40791 laid open on Mar. 6, 1982 (Japanese Patent application No. 55-116675 filed on Aug. 5, 1980). The ion implantation transfer path which is easy to be realized at an increased density constitutes a region serving for storing information, while the functional parts serving for writing, reading and the like operation are constituted by the permalloy transfer path.

FIG. 1 schematically shows an example of the conventional magnetic bubble memory device of the composite structure in which a permalloy transfer path is provided in vicinity of an ion implantation transfer path. In FIG. 1, reference numeral 4 denotes a non-magnetic garnet substrate, and 5 denotes a magnetic garnet layer formed on the substrate 4 and capable of holding and propagating magnetic bubbles. In a surface of the magnetic garnet layer 5, ions such as $H^+$, $H_2^+$, $Ne^+$ or the like are implanted with a predetermined ion implantation pattern. Reference numeral 21 denotes ion-implanted regions, and 22 denotes a non-implanted region. A cylindrical magnetic domain or magnetic bubble 1 is shown to exist under a biasing magnetic field $H_B$ of a predetermined magnitude applied in the direction shown in FIG. 1. An arrow 10 indicates the direction of magnetization within the bubble domain and arrows 11 indicate the direction of magnetization outside of the bubble domain. The ion-implanted region 21 exhibits inplane magnetization (as shown in arrows 12) due to magnetostriction produced upon ion implantation. At the boundary 2 between the ion-implanted region 21 and the non-implanted region 22, i.e. the edge of the ion-implanted region 21, there is developed an attractive (or converging) charged wall of positive charge attracting the magnetic bubble 1 or a repulsive (or diverging) charged wall of negative charge repulsing the magnetic bubble 1, in accordance with a driving magnetic field rotating in the plane of the magnetic garnet layer 5. The position of the attractive charged wall is moved along the edge (hereinafter referred to as ion implantation transfer path) of the ion-implanted region 21 in dependence on the direction of the in-plane rotating field to transfer the magnetic bubble. A permalloy transfer path 3 is provided on the magnetic garnet layer 5 through an insulating film 6 of $SiO_2$ or the like. The magnetic bubble 1 moving along the boundary 2 is transferred across the junction with the permalloy transfer path 3 to the latter under attraction exerted by a magnetic pole produced at an end portion of the permalloy pattern. However, in the conventional magnetic bubble memory device, difficulty has been encountered in effecting smooth transfer of the magnetic bubble from the ion implantation transfer path to the permalloy transfer path. More particulary, since the ion implantation transfer path is realized by making use of the boundary 2 between the ion-implanted region 21 and the non-implanted region 22, the magnetic bubble is required to traverse a portion 2' of the boundary 2.

FIG. 2 shows a cross section taken along lines II—II of FIG. 1. In the ion implantation transfer path, the magnetic bubble 1 is present below the ion-implanted region 21 and moved along the boundary 2 between the ion-implanted region 21 and the non-implanted region 22. Accordingly, upon transfer of the magnetic bubble 1 from the ion-implantation transfer path to the permalloy transfer path, the magnetic bubble 1 is required to traverse the boundary portion 2' at the junction between the ion implantation transfer path and the permalloy transfer path to enter the non-implanted region 22 underlying the permalloy transfer path. In this connection, it is noted that the boundary portion 2' has a steep vertical profile like that of the other boundary portion 2. As the consequence, the bubble 1 undergoes a sudden change in energy upon traversing the boundary protion 2', which provides a cause for making difficult smooth transfer of the magnetic bubble from the ion implantation transfer path to the parmalloy transfer path. The same holds for the bubble transfer from the permalloy transfer path to the ion implantation transfer path.

SUMMARY OF THE INVENTION

An object of the present invention is to provide a magnetic bubble memory device in which a magnetic bubble can easily traverse the junction between an ion implantation transfer path and a permalloy transfer path.

To that end, the ion implantation depth in a portion of the ion-implanted region at the junction between the ion implantation transfer path and the permalloy transfer path for reading or writing magnetic bubbles from the former to the latter or from the latter to the former continuously changes to make gentle the change in energy which the magnetic bubble undergoes upon traversing the boundary portion therebetween, thereby allowing good bubble transfer the ion implantation transfer path and the permalloy transfer path.

More specifically, as shown in FIG. 3, the boundary portion 2" between the ion-implanted region 21 and the non-implanted region 22 or the edge of the ion-implanted region 21 at the above-mentioned junction is inclined at a predetermined angle relative to a vertical direction.

DESCRIPTION OF THE PREFERRED EMBODIMENTS

Figure 4A:
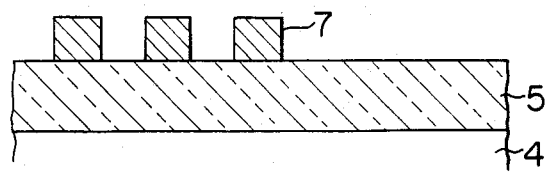
FIGS. 4a to 4e show, in cross section, subsequent steps of a method of fabricating a magnetic bubble memory device according to an embodiment of the present invention.
Figure 4B:
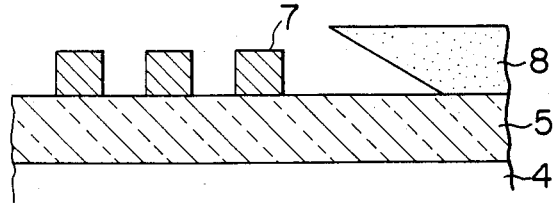

An embodiment of the invention will be described by referring to FIGS. 4a to 4e. At first, a magnetic garnet layer 5 which holds magnetic bubbles therein and in which the bubbles are propagated, is formed on a non-magnetic garnet substrate 4 through a conventional epitaxial growing process, and a mask pattern 7 for ion implantation is formed through a conventional photo-etching process (FIG. 4a). In the illustrated embodiment, the mask pattern 7 was formed of Mo in film thickness of 6000 Å. Subsequently, a photoresist pattern 8 of 1 μm thickness is formed, as shown in FIG. 4b. It is noted that the photoresist pattern 8 is imparted with an inversely tapered cross-sectional profile. In the illustrated embodiment, a negative type photoresist which exhibits great absorption of deep ultraviolet rays was used. A photoresist RAYCAST RD 2000N which has such a property and is commercially available from Hitachi Chemical Co., Ltd. of Japan, was exposed and then developed for 2 minutes at 25° C. using a developing solution of Shipley MF312 and water by 1:4, thereby providing a resist pattern having the inversely tapered cross-section.

Figure 4C:
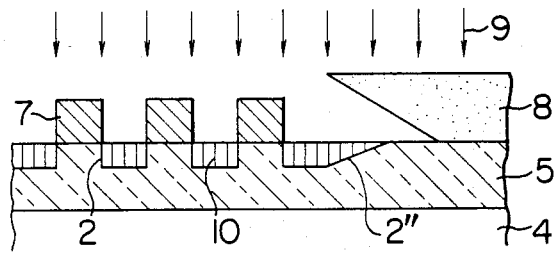

Next, ions 9 such as H+, H$_2$+ or Ne+ are implanted into the magnetic layer 5 by using a mask including the mask pattern 7 of Mo and the inversely tapered resist pattern 8, as shown in FIG. 4c. In a region of the magnetic layer 5 underlying the Mo mask film 7, it is completely shielded from the ion implantation and hence the edge 2 of the ion-implanted region 10 defining a boundary between the ion-implanted region 10 and the non-implanted region is formed vertically. On the other hand, in a region of the magnetic layer 5 underlying the inversely tapered resist mask pattern 8, the depth of ion implantation continuously changes in correspondence with a continuous change in the film thickness at the inversely tapered portion of the mask pattern 8.

Figure 4D:
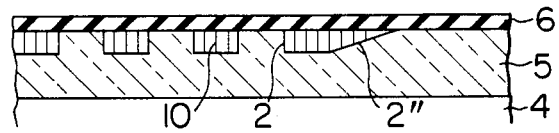

Thereafter, the Mo pattern 7 and the resist pattern 8 are removed through a plasma etching process using a gas of CF$_4$-series and a plasma asher using O$_2$ gas, respectively. Subsequently, an insulating film 6 of SiO$_2$ is deposited through a sputtering process (FIG. 4d). Finally, a permalloy transfer pattern 3 is formed through a conventional vapor deposition and photoetching process.

Figure 4E:
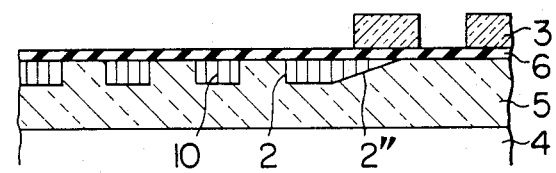

In this way, a magnetic bubble memory device is fabricated in which the ion implantation depth in a portion of the ion-implanted region 10 in vicinity of the permalloy transfer pattern 3 is continuously changed so that it becomes shallower in a direction toward the permalloy pattern or the edge 2" of the ion-implanted region 10 is inclined at a predetermined angle relative to a vertical direction, as shown in FIG. 4e.

Figure 5:
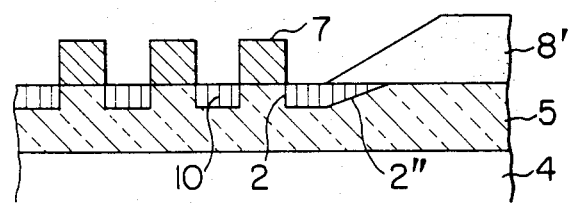
FIG. 5 is a view showing a method of manufacturing a magnetic bubble memory device according to another embodiment of the present invention.

In the case of the above-described embodiment, the resist pattern having the inversely tapered cross-section has been employed as a mask for providing the continuously varying ion implantation depth. However, since it is sufficient that the thickness of the resist pattern continuously changes, the ion implantation may be carried out by using a resist pattern 8' having a forwardly tapered cross-sectional profile, as shown in FIG. 5. For example, Shipley AZ 1350 J photoresist was deposited with 1 μm thickness and exposed. The exposed resist was developed for 2 minutes at 25° C. by use of an AZ developing solution and a water by 1:1 to form a pattern having a rectangular cross-sectional profile. Thereafter, the developed resist was subjected to a heat treatment for 30 minutes at 165° C. so that thermal flow provides a resist pattern having a forwardly tapered cross-sectional profile.

Any material such as metal, oxide or resin other than resists can be used as the mask 8 or 8' if it is not dissipated by the bombardment of ion implantation.

In the magnetic bubble memory device according to the present invention, operation margin at the junction between the ion implantation transfer path and the permalloy transfer path is excellently improved as compared with that of the conventional magnetic bubble memory device. More specifically, minute magnetic bubbles of 1 μm in diameter could be transferred without failing to traverse the junction under the biasing magnetic field in a wide range of 420 to 480 Oe. In contrast, in the case of the conventional device, the range of the biasing magnetic field in which magnetic bubbles of 1 μm in diameter can be transferred was found to be about 420 to 450 Oe, which is remarkably narrow when compared with the range applicable in the device according to the present invention.

Figure 6:
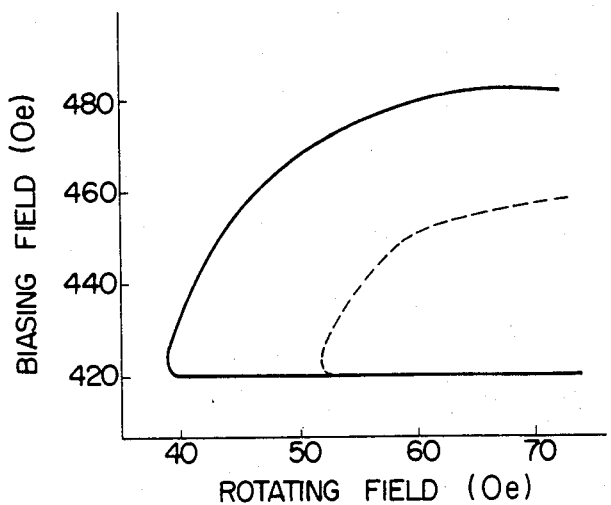
FIG. 6 is a biasing field versus rotating field diagram for explaining improvement on biasing field margin provided by the present invention.

The above effect is demonstrated in FIG. 6. The solid line in FIG. 6 is the result for a device according to the invention in which was fabricated under the following conditions:

Magnetic garnet layer: (YSmLuGa)$_3$(FeGa)$_5$O$_{12}$ of 1.2 μm thickness.

Implantation mask: AZ 1350 J resist of 1 μm thickness having forwardly tapered cross section with about 14° slope extending 4 μm in horizontal direction.

Implantation condition: double implantation of $1 \times 10^{16}$ H$_2$+ ions/cm$^2$ at 35 KeV plus $4.4 \times 10^{16}$ H$_2$+ ions/cm$^2$ at 80 KeV.

Implantation depth: normally 0.3 μm.

Edge of implanted region at junction: inclined by 86° relative to vertical direction (4° relative to horizontal direction).

The dotted line in FIG. 6 shows the result of a conventional device which was fabricated in the same manner without using the tapered implantation mask and hence has not the inclined edge of the ion-implanted region. From FIG. 6, it will be seen that the biasing field margin of the inventive device is improved about two times as compared with that of the conventional device.

Figure 7:
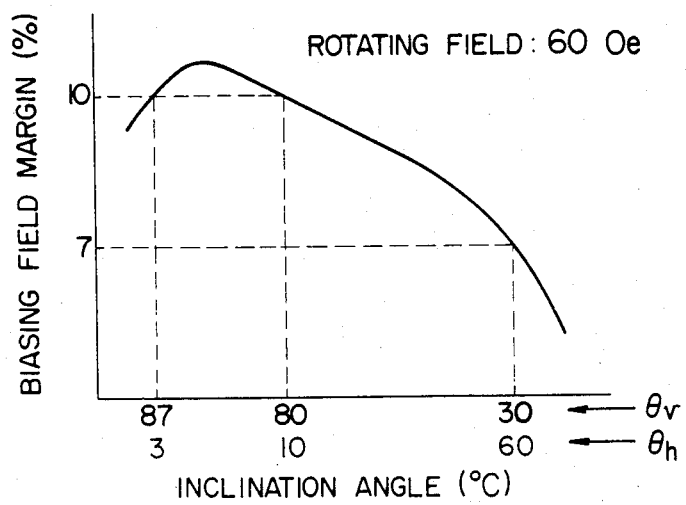
FIG. 7 is a graph showing a relationship between the inclination angle of the edge of the ion-implanted region and the biasing field margin.

FIG. 7 shows a relationship between the biasing magnetic field margin and the inclination angle $\theta_v$ or $\theta_h$ of the edge of the ion-implanted region relative to a vertical direction or a horizontal direction at the junction between the ion implantation transfer path and the permalloy transfer path. From the figure, it is noted that $\theta_v \geq 30°$ ($\theta_h \leq 60°$) is effective for improvement on the biasing field margin and $\theta_v = 80 \sim 87°$ ($\theta_h = 10 \sim 3°$) is most preferable. The results shown in FIG. 7 were obtained by using the samples which were fabricated under conditions similar to those mentioned with respect to FIG. 6 but using different mask dimensions for providing various inclination angles of the edges of the ion-implanted regions.

Figure 1:
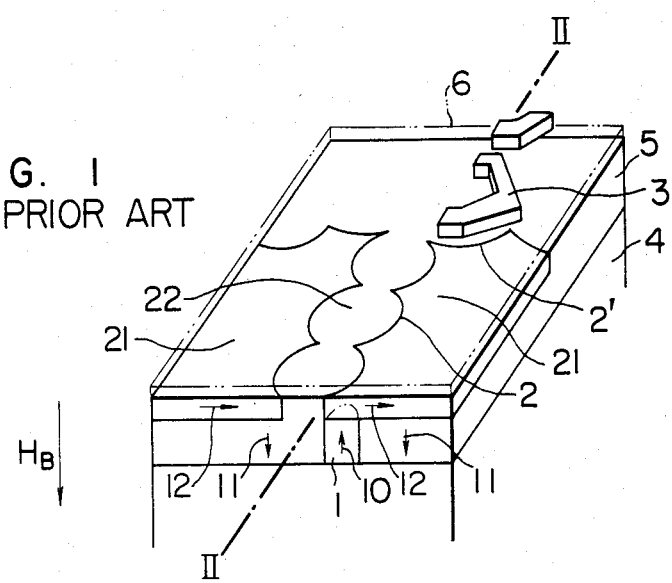
FIG. 1 is a view for schematically illustrating a conventional magnetic bubble memory device comprising an ion implantation transfer path and a permalloy transfer path.
Figure 2:
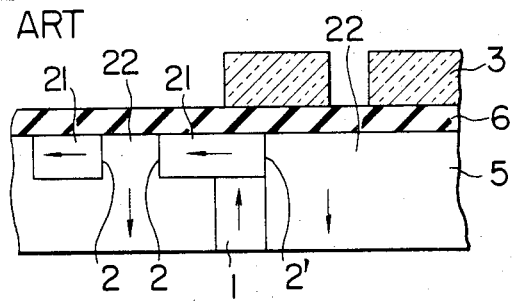
FIG. 2 is a cross section taken along lines II—II of FIG. 1.
Figure 3:
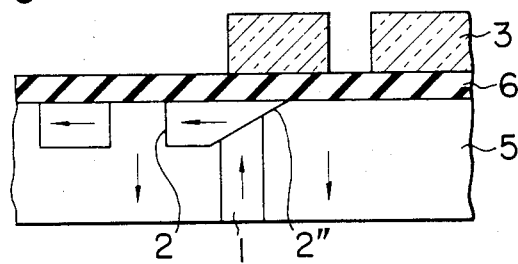
FIG. 3 is a cross section for illustrating a structure of a magnetic bubble memory device taught by the present invention.

Though in FIGS. 3 and 4e the ion-implanted region and the permalloy transfer path at the junction between the ion implantation transfer path and the permalloy transfer path are shown to at least partially overlap with each other for facilitating bubble transfer, this is not an essencial requirement. Various configurations including an overlapping relation and a non-overlapping relation may be employed depending upon desired pattern design.

As is apparent from the foregoing, the present invention provides a magnetic bubble memory device in which the transfer of magnetic bubbles between the ion implantation transfer path and the permalloy transfer path is extremely facilitated and which sufficiently operates with magnetic bubbles of minute size.

We claim:

1. A magnetic bubble memory device comprising:
   a layer of magnetic material which holds magnetic bubbles therein and in which the magnetic bubbles are propagated;
   an ion-implanted region for bubble storage formed with a predetermined pattern in a surface of said magnetic material layer, a first bubble transfer means being defined by the edge of said ion-implanted region bounding a non-implanted region in said magnetic material layer; and
   a second bubble transfer means of a permalloy formed with a predetermined pattern in vicinity of said first bubble transfer means for reading or writing the magnetic bubbles therefrom or therein, the ion implantation depth in a portion of said ion-implanted region in vicinity of said second bubble transfer means continuously changing so that it becomes shallower towards said second bubble transfer means and the edge of said portion of the ion-implanted region is inclined at a predetermined angle relative to a vertical direction.

2. A magnetic bubble memory device according to claim 1, wherein said predetermined inclination angle is not smaller than 30°.

3. A magnetic bubble memory device according to claim 2, wherein said predetermined inclination angle is a range from 80° to 87°.

4. A magnetic bubble memory device according to claim 1, wherein the inclined edge of said ion-implanted region at least partially overlaps with said second bubble transfer means through an insulating film.

* * * * *